(12) United States Patent
Vassant et al.

(10) Patent No.: US 9,711,697 B2
(45) Date of Patent: Jul. 18, 2017

(54) TERAHERTZ MODULATOR (75) Inventors: Simon Vassant, Paris (FR); Fabrice Pardo, Vitry-sur-Seine (FR); Jean-Luc Pelouard, Paris (FR); Jean-Jacques Greffet, Verriéres le Buisson (FR); Alexandre Archambault, Paris (FR); François Marquier, Longjumeau (FR)

(73) Assignee: Centre National de la Recherche Scientifique—CNRS, Paris (FR)

( * ) Notice: Subject to any disclaimer, the term of this patent is extended or adjusted under 35 U.S.C. 154(b) by 518 days.

(21) Appl. No.: 13/985,515

(22) PCT Filed: Feb. 14, 2012

(86) PCT No.: PCT/EP2012/052522
§ 371 (c)(1),
(2), (4) Date: Mar. 5, 2014

(87) PCT Pub. No.: WO2012/110520
PCT Pub. Date: Aug. 23, 2012

(65) Prior Publication Data
US 2014/0191188 A1    Jul. 10, 2014

(30) Foreign Application Priority Data
Feb. 14, 2011   (FR) ...................................... 11 51189

(51) Int. Cl.
*H01L 33/58* (2010.01)
*H01L 33/06* (2010.01)
(Continued)

(52) U.S. Cl.
CPC ................ *H01L 33/58* (2013.01); *G02F 1/00* (2013.01); *G02F 1/01* (2013.01); *H01L 33/06* (2013.01); *G02F 2203/13* (2013.01)

(58) Field of Classification Search
CPC ............... H01L 33/06; G02F 1/00; G02F 1/01
(Continued)

(56) References Cited

U.S. PATENT DOCUMENTS 6,933,581 B2 * 8/2005 Edamura et al. ............. 257/414
8,309,925 B2 * 11/2012 Mendis et al. ............. 250/336.1
(Continued)

OTHER PUBLICATIONS

Daniel Mittleman, "A terahertz modulator", Nature, vol. 444, Nov. 30, 2006, pp. 560-561.*
(Continued)

*Primary Examiner* — Jarrett Stark
*Assistant Examiner* — Charles N Ausar-El
(74) *Attorney, Agent, or Firm* — Osha Liang LLP (57) ABSTRACT

According to one aspect, the present invention concerns a terahertz modulator (1) intended to be used in a given frequency band of use. The modulator comprises a semi-conductor polar crystal (330) presenting a Reststrahlen band overlapping said frequency band of use and presenting at least one interface with a dielectric medium, coupling means (330) allowing the resanant coupling of an interface phonon polariton (IPhP) supported by said interface and of an incident radiation (2) of pre-determined frequency lying in said frequency band of use and means of control (22) apt to modify the intensity of the coupling between said interface phonon polariton and said incident radiation (2) by modification of the dielectric function of the polar crystal in the Reststrahlen band of the polar crystal (10).

20 Claims, 6 Drawing Sheets (51) Int. Cl.
*G02F 1/00* (2006.01)
*G02F 1/01* (2006.01)

(58) Field of Classification Search
USPC .......................................................... 257/13
See application file for complete search history.

(56) References Cited

U.S. PATENT DOCUMENTS

| | | | | |
|---|---|---|---|---|
| 8,380,016 | B1* | 2/2013 | Hochberg et al. | 385/3 |
| 8,450,690 | B2* | 5/2013 | Averitt et al. | 250/341.1 |
| 2003/0010979 | A1* | 1/2003 | Pardo et al. | 257/53 |
| 2003/0035610 | A1* | 2/2003 | Keys | B82Y 20/00 385/16 |
| 2006/0151807 | A1* | 7/2006 | Pardo et al. | 257/184 |
| 2006/0180830 | A1* | 8/2006 | Alavi et al. | 257/184 |
| 2006/0210279 | A1* | 9/2006 | Hillis et al. | 398/118 |
| 2008/0298405 | A1* | 12/2008 | Korenblit | H01S 1/02 372/28 |
| 2009/0262766 | A1* | 10/2009 | Chen et al. | 372/26 |
| 2012/0074323 | A1* | 3/2012 | Gomez rivas | G01J 3/02 250/338.4 |
| 2013/0092211 | A1* | 4/2013 | Collin et al. | 136/246 |
| 2014/0175283 | A1* | 6/2014 | Vassant | H01L 31/08 250/338.4 |
| 2015/0063739 | A1* | 3/2015 | Long | G02F 1/0126 385/1 |

OTHER PUBLICATIONS

Chen et. al., "Active terahertz metamaterial devices", Nature, vol. 444, Nov. 30, 2006, pp. 597-600.*

Nakayama et al., "Raman scattering by interface-phonon polaritons in a GaAs/AlAs heterostructure" Rapid Communications, Physical Review B, vol. 38, No. 9, Sep. 15, 1988-II, 1988 The American Physical Society, pp. 6348-6351.*
Vassant et al, "Optical control of THz reflectivity with surface waves" Proceedings of SPIE—The Internatinal Society for Optical Engineering—Sep. 2011.*
International Search Report for corresponding International Application No. PCT/EP2012/052522, mailed Jun. 6, 2012 (6 pages).
Written Opinion for corresponding International Application No. PCT/EP2012/052522, mailed Jun. 6, 2012 (10 pages).
L. Fekete et al., "Active optical control of the terahertz reflectivity of high-resistivity semiconductors"; Optical Society of America; V. 30, No. 15; XP-002662625; Aug. 1, 2005 (3 pages).
E. Hendry et al., "Optical Control over Surface-Plasmon-Polariton-Assisted THz Transmission through a Slit Aperture"; The American Physical Society; XP-002662626; Mar. 28, 2008 (4 pages).
R. Kersting et al., "Terahertz phase modulator"; Electronics Letters; vol. 36, No. 13; Jun. 22, 2000 (2 pages).
T. Kleine et al., "Room-temperature operation of an electrically driven terahertz modulator"; American Institute of Physics; vol. 84, No. 18; May 3, 2004 (3 pages).
I. H. Libon et al., "An optically controllable terahertz filter"; American Institute of Physics; vol. 76, No. 20; May 15, 2000 (3 pages).
S. Vassant et al., "Tailoring GaAs terahertz radiative properties with surface phonons polaritons"; American Institute of Physics; 2010 (3 pages).
X. Wu et al., "Thermally Tuning Terahertz Surface Plasmon Polaritons in Corrugated Semiconductor Films"; The Japan Society of Applied Physics; 48; (2009) (6 pages).
C. Janke et al., "All-optical switching of the transmission of electromagnetic radiation through subwavelength apertures"; Optical Society of America; vol. 30, No. 18; Sep. 15, 2005 (3 pages).

* cited by examiner

TERAHERTZ MODULATOR

TECHNICAL DOMAIN OF THE INVENTION

The present invention relates to active components in the domain of terahertz frequencies. More precisely, the invention relates to a modulator for terahertz radiations.

STATE OF THE ART

The terahertz domain is generally defined by radiations having frequencies of between 0.1 and 30 THz. This frequency band overlaps the domain of electronics and the domain of photonics. The devices in the terahertz domain come up against intrinsic operating limits: the working frequencies are too high for components based on electronics and the energies are too low to work effectively with photons. Nevertheless, this frequency domain has a high potential for applications, for example in the domain of telecommunications in which the frequency ranges usually allocated to telecommunications are becoming saturated. Notably, in the United States, the allocation of ranges of frequencies up to 0.3 THz is already saturated. This potential for applications is encouraging the development of components allowing terahertz radiations to be manipulated, and notably modulators.

In the domain of terahertz modulators, a device based on resonant transmission through a grating of sub-wavelength holes, structured in an Indium Antimonide (InSb) crystal, is known. Such a device is described for example in Janke et al., "*All-optical switching of the transmission electromagnetic radiation through sub-wavelength apertures*" (Optics Letters Vol. 30, No. 18, pages 2357-2359, 2005). In this document, it is disclosed how resonant transmission due to the coupling between a terahertz radiation and surface polariton plasmons at the surface of the crystal can be controlled around 0.5 THz by optically exciting the structure. Nevertheless, as the results published in this document show, such control is limited, including at low temperature. In addition, at ambient temperature, it is seen that transmission is limited to 0.2% at the maximum transmission.

One object matter of the present invention consists of presenting a terahertz modulator that can notably operate more efficiently at ambient temperature.

SUMMARY OF THE INVENTION

According to a first aspect, the invention related to a terahertz modulator intended to be used in a given frequency band of use comprising:
- a semiconductor polar crystal (10) having a Reststrahlen band covering said frequency band of use and having at least one interface with a dielectric medium;
- coupling means allowing the resonant coupling of an interface phonon polariton (IPhP) supported by said interface and of an incident radiation (2) of frequency in said frequency band of use; and
- means of control (20) apt to modify the intensity of the coupling between said interface phonon polariton and said incident radiation polariton by modification of the dielectric function of the polar crystal (10) in the Reststrahlen band of the polar crystal (10).

The resonance effect of the dielectric function of a polar crystal in the so-called Reststrahlen frequency band of the crystal is thus used to create a terahertz modulator of remarkable efficiency which operates at ambient temperature. The modulator can operate in reflection, the variation of the intensity of the coupling between the interface phonon polariton and the incident radiation resulting in a variation of reflectivity of the component at the wavelength of the incident wave, or in transmission, according to the implementation of the component.

Advantageously, the polar crystal has two interfaces with a dielectric medium, said interfaces being sufficiently close to allow the coupling of interface phonon polaritons propagating along each of the interfaces. The coupling of two interface phonon polariton modes allows the confinement of the electromagnetic field to be further accentuated and the efficiency of the modulator to be improved, notably by making the variation of the coupling more sensitive by the means of control.

Typically the distance between the two interfaces can be less than a hundred nanometers.

According to an example, the semiconductor polar crystal is a III-V semiconductor, for example gallium arsenide (GaAs), aluminum arsenide (AlAs), indium phosphide (InP), indium arsenide (InAs), gallium phosphide (GaP), galium nitride (GaN), etc. According to another example, the semi-conductor polar crystal is a II-VI semi-conductor for example Zinc Selinide (ZnSe), mercury telluride (HgTe), Cadmium telluride (CdTe), etc. or a I-VII semi-conductor, for example sodium chloride (NaCl), potassium bromide (KBr), etc. According to another example, the semi-conductor polar crystal is a IV-IV semi-conductor such as silicon carbide (SiC). In addition, ternary alloys (with three elements, such as e.g. AlGaAs), quaternary alloys (with four elements, for example InGaAlAs) or more, can also be used. In the following description, the term semi-conductor polar crystal encompasses all of these materials.

According to a variant, the polar crystal is doped. The generation of free carriers in the polar crystal allows the resonance band of the dielectric function to be widened and/or to be shifted.

According to a first embodiment of the modulator according to the invention, the coupling means are integrally formed in the polar crystal. In other words, the polar crystal is structured to form the coupling element between the interface phonon polariton and the incident radiation.

For example, the polar crystal is structured to form one or a plurality of crystal blades each forming an optical antenna intended to couple with the incident radiation, the large faces of each of said blades forming two interfaces with a dielectric medium, for example air or vacuum.

Advantageously, the coupling means comprise a plurality of these blades. According to a first example, the blades are all identical, in shape and in size, optimized for coupling with an incident radiation of frequency lying in a narrow spectral band of use. According to a second example, said blades present different shapes and sizes which allow the spectral band of use of the modulator to be widened.

According to a first variant, the said blade(s) are laid out perpendicular to a substrate, said substrate being intended to be laid out in a plane perpendicular to the incident plane of the incident radiation.

According to a second variant, said elements are laid out in a plane and form a suspended membrane, the plane of the membrane being intended to be laid out in a plane perpendicular to the incident plane of the incident radiation.

In the case of the first embodiment thus described, the means of control can comprise a light source intended to illuminate said interface and with a given spectral band such that the energy of the photons produced by said light source is greater than the energy gap of said polar crystal. Illumination by a single source, for example a source emitting in the visible for polar crystals such as GaAs, thus allows the modification of the dielectric function of the polar crystal and therefore of the intensity and/or the frequency of coupling, which results in a variation of the reflectivity of the modulator. Advantageously, a short wavelength, i.e. presenting a photon energy much greater than the gap, will be used as the control light source. A wide-band light source can also be used. In the case where the polar crystal is in the shape of a crystal blade, illumination by the control light source can be provided on each of the interfaces formed by the large faces of the blade.

When the coupling means comprise a plurality of blades, they can be laid out along a single direction. Alternatively, the blades can be laid out along two perpendicular directions, allowing the system to be insensitive to the polarization of the incident terahertz radiation.

According to a second embodiment of the modulator according to the invention, the polar crystal forms at least one thin layer surrounded by at least a first and a second barrier layer of a semi-conductor dielectric material with a high energy gap so as to form with the polar crystal layer, one or a plurality of quantum wells.

For example, the coupling means can comprise a group of optical nano-antennas and a mirror arranged to form a resonant cavity inside of which said quantum wells are found. Thus, electromagnetic field confinement can notably be obtained within the quantum wells.

Advantageously, a spacer can allow the width of said optical resonance cavity to be adapted.

In the second embodiment thus described, the means of control can be electrical means of control apt to control the electron density in the quantum well(s).

According to a second aspect, the invention concerns a method of modulating an incident radiation of terahertz frequency lying in a given frequency band of use, included in the Reststrahlen band of a semi-conductor polar crystal, comprising the steps of:

resonant coupling of the incident radiation of terahertz frequency and of an interface phonon polariton at an interface of the polar crystal and of a dielectric medium;

variation of the intensity of the coupling by variation of the dielectric function of the polar crystal in the Reststrahlen band of the polar crystal.

The variation of the intensity of the coupling can result in a variation of the reflection or of the transmission of said incident radiation on said interface between the polar crystal and the dielectric medium.

According to a first embodiment of the method, the variation of the dielectric function of the polar crystal is obtained by illuminating said interface between the polar crystal and the dielectric medium with a visible light source, the polar crystal being structured to form at least one optical antenna allowing coupling with the incident radiation.

According to a second embodiment of the method, in which the polar crystal forms at least one thin layer between at least a first and a second barrier layer of semi-conductor dielectric material with a high energy gap so as to form one or a plurality of quantum wells, the variation of the dielectric function of the polar crystal is obtained by applying a voltage to the polar crystal to control the electron density in the quantum well(s).

According to a third aspect, the invention concerns a data transmission system comprising a THz emission source, a modulator according to the first aspect and a system THz radiation detector, the modulator being controlled as a function of a signal containing said data.

BRIEF DESCRIPTION OF THE FIGURES

Other features and advantages of the invention will appear with the reading of the description that follows, illustrated by the figures in which.

DETAILED DESCRIPTION

Figure 1:
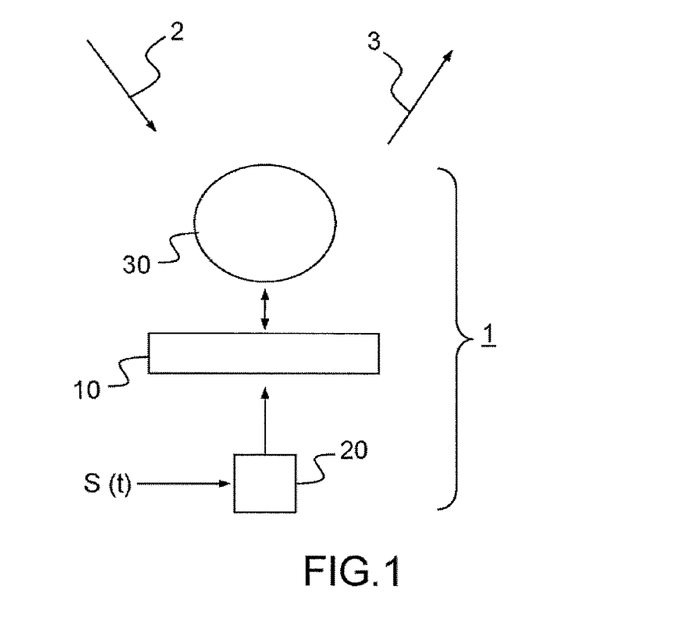
FIG. 1 is a diagram schematically illustrating an implementation of the invention.

FIG. 1 is a diagram that shows schematically a modulator according to the invention in an example of implementation. In this example, incident terahertz radiation 2 of pre-determined frequency is reflected by a terahertz modulator 1 according to the invention to give reflected terahertz radiation 3 the intensity of which is modified with respect to the intensity of the incident terahertz radiation 2 as a function of a control signal S(t), for example a signal carrying information that is to be transmitted. The modulator 1 generally comprises a polar crystal 10, means of control 20 and coupling means 30. The control signal S(t) is supplied to the means of control 20 to modulate the intensity of the reflected radiation as a function of time. As will be described in detail in the following, the means of control 20 can be optical or electrical. The polar crystal 10 comprises an interface with a dielectric medium (not shown in FIG. 1), for example vacuum, air, or a material behaving as a dielectric around the pre-determined frequency of the incident terahertz radiation 2.

Generally, a crystal, the atoms of the elementary lattice of which, possess different electronegativities, is called a polar crystal. In polar crystals, the movement of atoms with respect to each other influences the polarizability and therefore the dielectric function. Polar crystals present a resonance of their dielectric function for photon energies close to those of optical phonons, in a frequency band called the Reststrahlen band. In this Reststrahlen band, the real part of the dielectric function is negative. The material then behaves optically as a metal due to its high reflectivity and it supports surface phonon polaritons, a mixture between an optical phonon and an electromagnetic wave, everything propagating at the interface between the polar crystal and a dielectric medium. The resonance of the dielectric function is very well modeled by a Lorenz model, and the dielectric function can be written, according to Born et al. (M. Born and K. Huang "Dynamical theory of crystal lattices", Oxford University Press, New York, 1954):

$$\varepsilon(\omega) = \varepsilon_\infty \left(1 + \frac{\omega_L^2 - \omega_T^2}{\omega_T^2 - \omega^2 - i\Gamma\omega}\right) \quad (1)$$

Where $\omega_L$ and $\omega_T$ are the frequencies of the longitudinal and transverse optical phonons respectively and $\Gamma$ is a damping term.

Figure 2A:
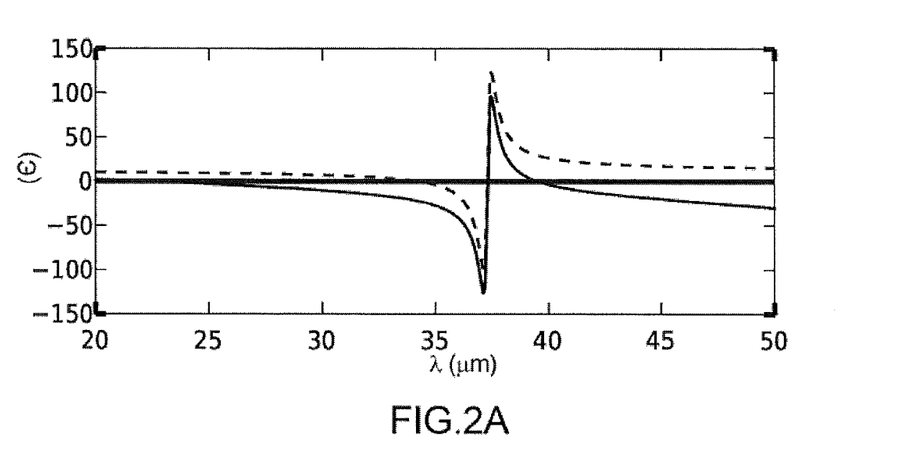
FIGS. 2A and 2B are curves showing the evolution of the real part and of the imaginary part respectively, of the dielectric function as a function of wavelength for GaAs and doped GaAs.
Figure 2B:
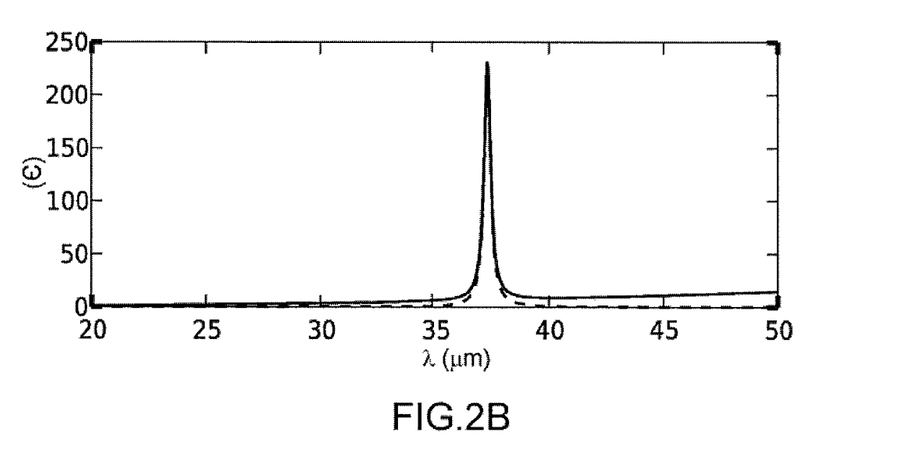

FIGS. 2A and 2B show as a function of the wavelength, the real part and the imaginary part respectively of the dielectric function of gallium arsenide (GaAs), typical of polar crystal s, for pure GaAs (dotted curve) and for GaAs doped with a carrier density of $1.5 \times 10^{18}$ cm$^{-3}$ (full curve). For example, for a GaAs/air interface, the range of wavelengths where the surface wave can exist is given by the relation Re($\in$)<-1, where $\in$ is the dielectric function of GaAs. This corresponds to the following range of wavelengths 35.57 μm<λ<37.30 μm. For doped GaAs, the range of wavelengths corresponding to the conditions for the existence of surface phonon polaritons is widened.

While most published studies have tried to avoid the ranges of frequency corresponding to the Reststrahlen zone in which the resonance brings about extremely rapid variations of the dielectric function and therefore of the reflectivity, the applicant has shown that, on the contrary, this frequency zone can be put to good use for the design of extremely efficient modulators in the terahertz domain, as will be demonstrated in the following description with examples of particular embodiments.

In particular, the polar crystals that are potentially interesting for the generation of surface phonon polaritons in the terahertz frequency domain are III-V semi-conductors, for example gallium arsenide (GaAs), aluminum arsenide (AlAs), indium phosphide (InP), indium arsenide (InAs) and gallium phosphide (GaP). The II-VI semi-conductors are also polar crystals presenting Reststrahlen features in the spectral band of interest, for example, ZnSe, HgTe, CdTe, as well as the IV-IV elements such as SiC, the I-VII elements or alloys composed of 3 (ternary), 4 (quaternary) or more elements. Generally, the Reststrahlen band of these materials is situated in the far infra-red, between 10 and 50 microns, i.e. between 6 and 30 terahertz.

According to a variant, a doped polar crystal can be used to increase the number of carriers. The doping of the polar crystal 10 allows the Reststrahlen band of the crystal for which the real part of the dielectric function is negative, to be increased and shifted (see FIG. 2A). Thus the range of wavelengths over which it is possible to work with interface modes is increased. Thus, doping can be optimized to obtain better modulation. The optimum value depends on the geometry and on the nature of the polar crystal. For example for GaAs, as will be described in the following, the applicant has obtained better results for the modulation with doping on the order of $1 \times 10^{18}$ cm$^{-3}$.

Interface phonon polaritons being evanescent modes, it is not possible however, to couple them with an incident propagating field by simply illuminating a flat surface. The coupling means 30 allow the coupling of the incident terahertz radiation 2 and of the evanescent field of the interface phonon polariton carried by the interface between the polar crystal and the dielectric medium. For example, in an embodiment where the incident terahertz radiation 2 is a plane wave in free space, the coupling means can comprise a prism in an Otto configuration, a prism in a Kretschman configuration, a coupling grating, a single optical antenna or a series of such antennas. The coupling means can be obtained for example by structuration of the polar crystal itself (optical antenna, grating) or by structuration in the form of a stack of thin layers generating a resonant cavity, such as will be described later. The coupling then gives rise to resonant absorption and can be demonstrated by analyzing the spectral reflectivity of the modulator 1. A frequency band of use of the modulator Δν, can be defined that is the coupling frequency band included in the Reststrahlen band of the crystal and for which the coupling means 30 allow resonant coupling of the terahertz radiation and of an interface phonon polariton. In an alternative embodiment, the incident THz radiation 2 can be a guided wave or a surface wave. The coupling means of the modulator 1 to the guide can then comprise an impedance adapter ("taper") allowing optimal transmission from the guide to the modulator.

The means of control 20 such as shown schematically in FIG. 1 allow the coupling to be varied by modifying the dielectric function of the polar crystal 10 over the Reststrahlen band. In particular, the means of control 20 allow the dielectric function of the polar crystal to be modified at the frequency of the incident terahertz radiation 2. The modification of the coupling leads to a variation of the reflectivity of the modulator 1 and therefore to a variation of the intensity of the reflected terahertz radiation 3. In fact, the incident terahertz radiation 2 can be integrally coupled to an interface phonon polariton so that all of the incident energy is transferred to the interface wave. The interface wave then propagates and the energy is dissipated in the polar crystal 10. The reflectivity for this type of coupling is then zero. By decreasing the efficiency of coupling at a given wavelength, only a part of the incident energy is ceded to the interface phonon polariton and the excess energy is then reflected. In other words, the control can change not only the intensity but also the frequency of coupling. If a given wavelength is considered, the reflectivity is modulated. The interface phonon polaritons excited by the incident terahertz radiation 2 being strongly confined in the vicinity of the interface of the polar crystal 10, excitation by the means of control 20 for modifying the optical properties of the polar crystal 10 can be spatially limited to a zone of excitation of small volume where the field of the interface phonon polariton is confined.

In the following description, two principal embodiments are described for the implementation of a THz modulator according to the invention. The first embodiment, described by means of FIGS. 3 to 6, implements optical means of control, while the second embodiment, described by means of FIGS. 7 to 10, implements electrical means of control.

Examples of fabrication of a THz modulator according to the first embodiment (optical means of control) are first described.

Figure 3:
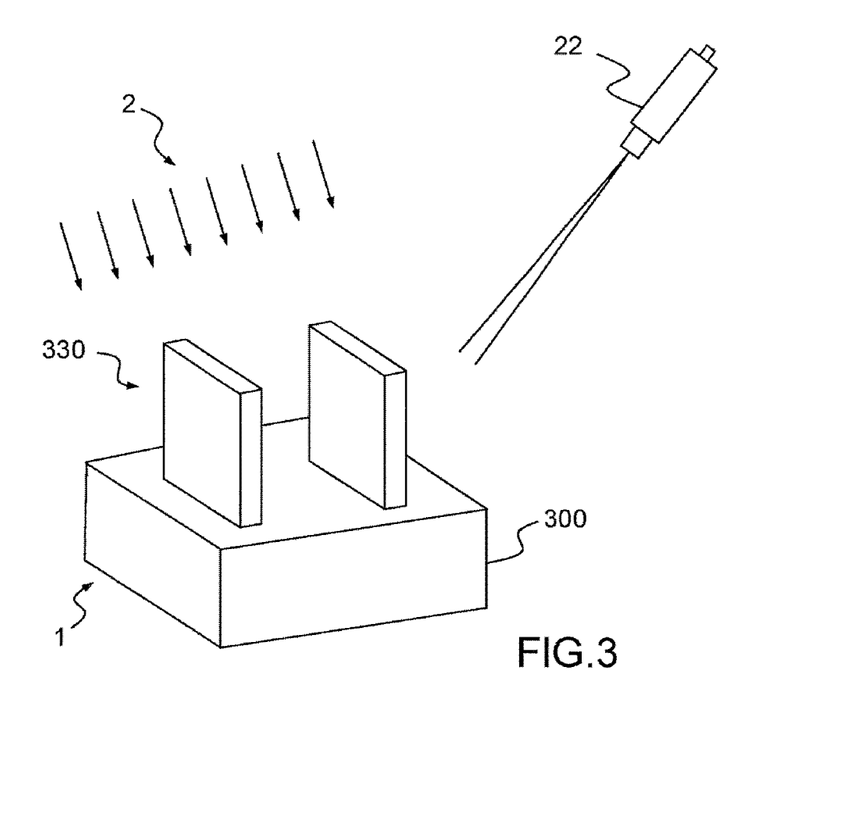
FIG. 3 shows a terahertz modulator according to a first embodiment of the invention.
Figure 4A:
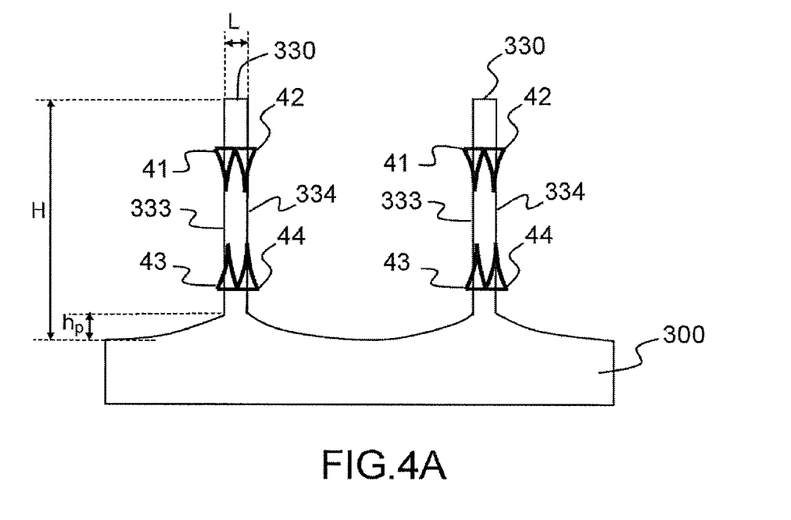
FIG. 4A shows schematically, the coupling of the interface phonon polaritons in a terahertz modulator according to the first embodiment of the invention

FIGS. 3 and 4A show a first example of a THz modulator according to the first embodiment. In this example, the polar crystal is structured to form at least one crystal blade 330, each blade forming an optical antenna allowing coupling with the incident radiation. An optical antenna is generally understood to be an element capable of transferring the energy of an incident radiation to a more confined volume. Optical nano-antennas have been widely studied and the article by L. Novotny et al. (<<Antennas for light>>, Nature Photonics, Vol 5, February 2011) provides a very good description of them. Here, the blade of polar crystal is sized so as to form a resonator the dimensions of which are adjusted as a function of the desired frequency properties of the coupling. The resonator creates an evanescent field that will allow coupling with the incident radiation allowing the energy of the incident wave to be confined.

In the example described in FIGS. 3 and 4A, each crystal blade 330 presents the shape of a wall the large faces of which are of substantially square or rectangular shape and that rises perpendicularly from the surface of a substrate 300 that can itself be fabricated in the same crystal. The wall 330 comprises parallel flanks 333, 334 each forming an interface between the polar crystal and the neighboring dielectric medium, in this example vacuum or air. Alternatively, the blade of the crystal can be surrounded by a dielectric material, for example an organic dielectric material of resin type. The interfaces 333, 334 support the interface phonon polaritons 41-44. Advantageously, the width L of the blades 330 is sufficiently small so to allow coupling between the interface phonon polaritons 41-43 propagating at the interface 333 and the interface phonon polaritons 42-44 propagating at the interface 334 on the two sides of the blade 330. This allows the confinement of the electromagnetic field to be increased by increasing the effective index of the mode. Typically, the applicant has shown that a width of the blades of less than a few hundred nanometers allows such a coupling to be achieved. Conversely, a sufficiently large blade width must be kept so as to keep the number of carriers to a minimum.

As explained previously, the blade forms a resonator the shape and dimensions of which will determine the frequency band of the coupling that will also be the band of use of the modulator. When the blade is of a substantially rectangular shape, only the vertical modes will exist and the height H of the blade should be optimized as a function of the wavelength of the coupling desired. Generally, the height H of the optical antennas will be chosen to be on the order of $\lambda_r/4n_{eff}$ where $\lambda_r$ is the resonant frequency and $n_{eff}$ the effective index of the mode. The effective index depends strongly on the nature of the polar crystal and the level of doping thereof. For example, for a polar crystal of GaAs, the wavelength of the resonance is close to 35.5 microns. The thickness of the optical blade can be chosen between 60 and 80 nm, the height of the antennas on the order of 800 nm, the effective index lying between 7.5 and 10 for a doping of $1.5 \times 10^{18}$ cm$^{-3}$. In the case of a square shaped blade, the resonator can present both horizontal and vertical modes and the optimization parameters of the resonator will be modified. Fine optimization of the resonator can be done numerically using codes of the "Rigorous Coupled Wave Analysis" (RCWA) type, described notably in L. Li, Journal of Optical Society of America A, 14(10), 2758 (1997), or "Rigorous Maxwell with Constitutive B-spline approximation" (RMCB) type described in P. Bouchon, Journal of Optical Society of America A, 27(4), 696 (2010). Commercial codes (Reticolo) can also be used.

In the example in FIG. 4A, the etching foot at the foot of the wall 330, visible in FIG. 4A, is a consequence of poorly controlled etching and can be modeled by a parabolic shape over a height $h_g$ for which the foot of the wall has a flared shape, so as to be taken into account in the optimization of the structure.

Figure 4B:
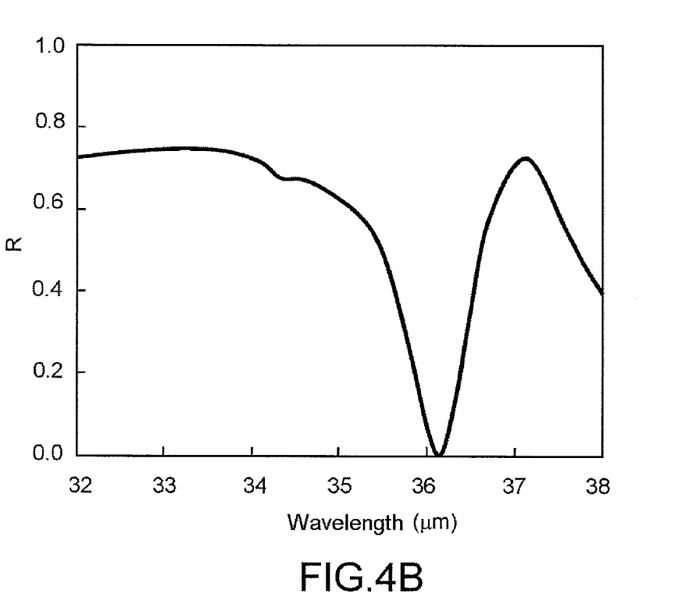
FIG. 4B shows the curve of reflectivity as a function of wavelength, calculated in a device of the type of FIG. 4A.

As an example, FIG. 4B shows the reflectivity R of a grating according to the embodiment shown in FIG. 4A, with a polar crystal of GaAs. For the calculation of the reflectivity, the following parameters have been considered: period of the walls 330 equal to 2.5 μm, height of the walls equal to 2.8 μm, height $h_p$ equal to 600 nm, width of the walls equal to 65 nm. It is seen in this figure, that the reflectivity falls to zero at a wavelength close to 36 μm (corresponding to a frequency of 8.3 terahertz included in the Reststrahlen band of GaAs), due to the resonant coupling between the incident terahertz wave and the interface phonon polaritons.

The optical means of control 22 illuminate the blade(s) of the polar crystal 330 with light radiation the photon energy of which is greater than the energy gap of the polar crystal, so as to create free carriers. The creation of free carriers leads to a modification of the dielectric function of the polar crystal that gives rise to a shift of the resonance of the interface phonon polariton. For example, for a polar crystal formed from GaAs, the energy gap at ambient temperature is $E_g=1.42$ eV. A light source of visible wavelength, for example of a laser diode type, will produce photons of sufficient energy to produce free carriers. For an emission wavelength for example of around 630 nm, the photon energy is equal to around 1.96 eV. In the case of another polar crystal, for example GaN, the energy gap being 3.44 eV, the light source must emit wavelengths of less than 360 nm Generally, any radiation with energy greater than the energy gap of the polar crystal could be used. Advantageously, a short wavelength will be chosen (photon energy much greater than the gap) to reinforce the absorption near the surface. Due to the very strong confinement of the electric field, it is possible to control the THz modulator thus produced with a low power visible source. A wide-band light source can be chosen. According to a variant, illumination of both sides of the blade 330 forming the coupling antenna can be performed.

The choice of a group of optical antennas for example formed by optical crystal blades of the type described previously, could make it possible for example to cover the entire surface of the component illuminated by the control light source 22. Blades of identical shape and size could then be chosen to optimize the coupling in a narrow frequency band of use, or on the contrary, the shape and/or the size of the blades could be varied to widen the frequency band of use. For example, in the case of crystal blades, blades could be chosen of which the large faces are square or rectangular and with different sizes. In addition, it is possible to provide a periodic layout of these antennas, for example to facilitate the fabrication of the component; however, the periodicity and the density of the distribution of the antennas has only little effect on the coupling, the coupling being obtained by the sole effect of the radiation of the evanescent field by the antenna. However, the antennas should not be spaced too far apart so as not to excite diffracted orders. Typically, the antennas will be separated by a distance of less than the wavelength. Finally, the antennas can be chosen to be arranged along a principal direction. Alternatively, they can be chosen to be arranged along two substantially perpendicular directions, so as to remove the sensitivity of the component to the polarization of the incident terahertz radiation.

Figure 5:
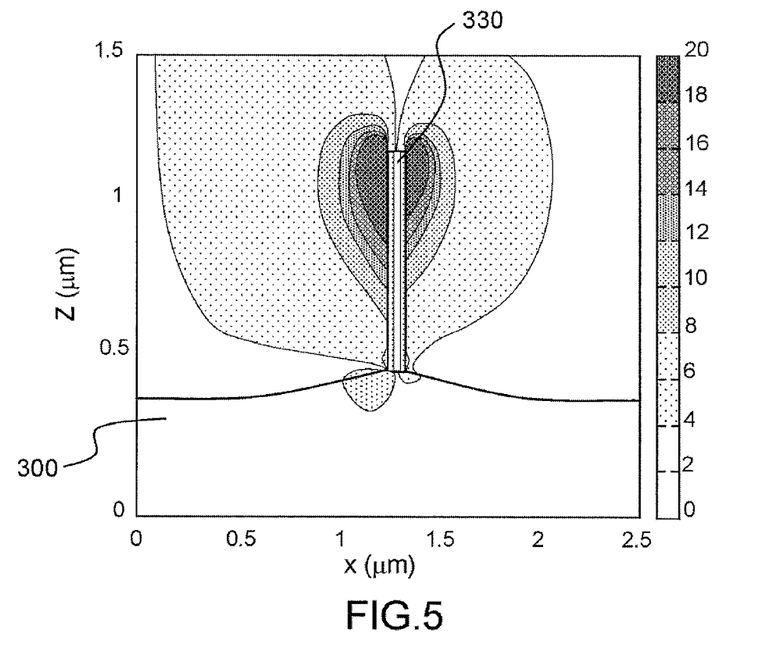
FIG. 5 shows the electric field intensity calculated in the vicinity of an interface between the polar crystal and a dielectric in a terahertz modulator according to the first embodiment of the invention.

FIG. 5 demonstrates the confinement of the electric field in a structure of the type shown in FIGS. 3 and 4. The intensity of the electric field along the direction perpendicular to the interfaces 333 and 334, and normalized by the intensity of the incident electric field is calculated (for example using RCWA, RMCB or Reticulo type software) for a periodic layout of resonant antennas. FIG. 5 shows only one period (2.5 microns) of the periodic structure. The antenna shown is of GaAs doped at $1.5 \times 10^{18}$ cm$^{-3}$, it is 800 nm high, 80 nm wide. The high effective index of the coupled mode between the two interfaces 333, 334 allows the electrogmagnetic field to be confined in a very small volume. This makes it possible to limit the volume in which the concentration of electrons must be modified in order to modify the intensity of the coupling and thus facilitates the optical excitation of the polar crystal 10. The applicant has thus demonstrated that at resonance, for a polar crystal of doped GaAs, the volume of the coupled mode is on the order of $\lambda^3/10^6$ where $\lambda$ is the wavelength of the incident THz radiation.

Figure 6:
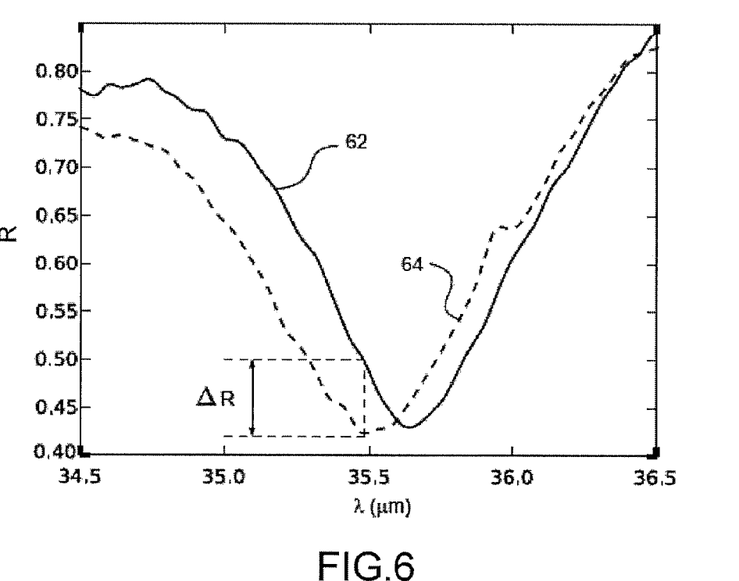
FIG. 6 shows curves of spectral reflectivity of the modulator according to the first embodiment of the invention for two distinct values of control of the modulator.

FIG. 6 shows measurements of spectral reflectivity performed by the applicant on a THz modulator produced according to a first embodiment of the invention. More precisely, the modulator the reflectivity of which is shown in FIG. 6, comprises a crystal of doped GaAs at the surface of which a grating of walls is formed, the height and the period of which are 65 nm, 800 nm and 2.5 μm respectively with a height of the etching foot of 120 nm. The crystal is illuminated by a HeNe laser at the wavelength of 633 nm with an angle of incidence of 15°. FIG. 6 comprises a first curve 62 that shows the spectral reflectivity of the modulator 1 in a situation where the optical means of control 22 are not activated and a second curve 64 that represents the spectral reflectivity of the modulator in a situation where the optical means of control 22 are activated with an illuminating power of 4 mW/cm$^2$. FIG. 6 clearly shows a shift of the frequency of the resonance of the interface phonon polariton towards the shorter wavelength under an illumination at 633 nm. Quantitatively, the measured shift is 230 nm. At the resonant frequency $\lambda_R$, the coupling is maximum and corresponds to a resonant absorption at which the reflectivity is minimum. The relative variation of reflectivity is defined by:

$$\frac{\Delta R}{R} = \frac{R_- - R_+}{R_-} \quad (2)$$

where R is the minimum reflectivity, and $R_+$ is the maximum reflectivity of the modulator 1. For this example, the maximum variation is obtained by considering R as being the reflectivity of the modulator 1 when the optical means of control 22 are activated and $R_+$ is the reflectivity of the modulator 1 when said means are deactivated. The relative variation reaches 44%. The applicant has shown that the theoretical optimization of the coupling, by modifying the geometry of the walls, in particular the height of the latter as a function of their width, allows almost total absorption of the radiation and a relative variation of reflectivity of more than 4000% can be attained. For an un-doped GaAs crystal, the applicant has calculated that the width and the height of the optimized coupling antenna of the type represented in FIGS. 3 and 4, lie between 60 and 70 nm respectively for the width, with a height of greater than or equal to 2.8 microns. Generally, as explained previously, the periodicity of the walls is not very important. In addition, at a given wall thickness there is an optimum height at which the incident radiation is totally absorbed.

Figure 7A:
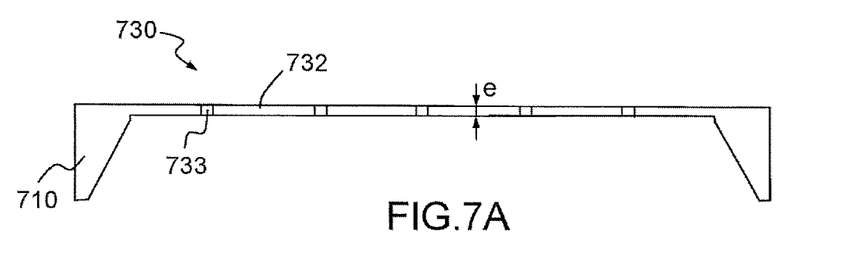
FIGS. 7A and 7B show schematically a variant of a modulator according to the first embodiment of the invention.
Figure 7B:
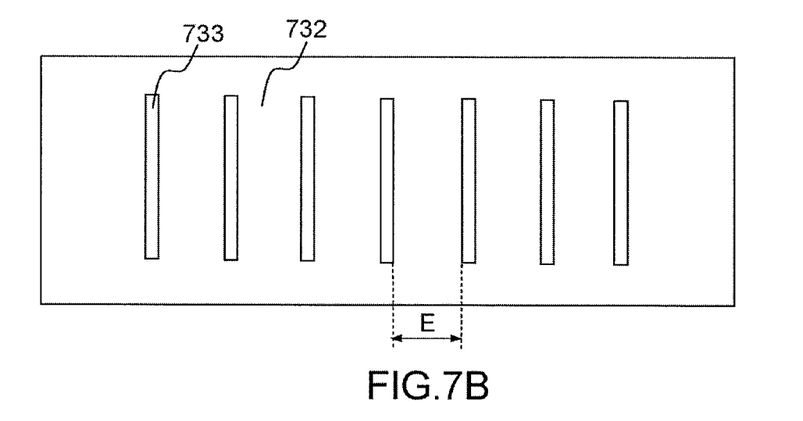

A modulator according to the first embodiment such as described in FIGS. 3 and 4A can be fabricated according to classic processes of microelectronics. For example, the fabrication of a modulator such as that shown in FIG. 3 comprises the following steps of fabrication: dehydration and deposition of a thin layer of resin on the GaAs crystal; negative electron lithography of the resin; deposition of a titanium/nickel mask by lift-off to serve as protection for the dry etching; chemical removal of the mask. A variant preventing the formation of an etching foot can use a stop layer. Starting with a substrate, a stop layer is deposited by epitaxy, for example 100 nm of $Al_{80}Ga_{20}As$, above which a layer of polar crystal, for example GaAs, is deposited the thickness of said layer being equal to the desired height of the antennas. This is followed by etching of the polar crystal, selective etching which will stop on the stop layer FIGS. 7A and 7B show a cross sectional view (FIG. 7A) and a top view (FIG. 7B) of a variant of a modulator according to the first embodiment previously described. In this variant, the polar crystal is structured to form a group of polar crystal blades 732 separated by slits 733 and which form a structured membrane 30, suspended above a substrate 710. The geometry of the polar crystal blades 732 lying between two slits corresponds to the geometry of the crystal blades or "walls" 330 of the embodiment previously described. As in the example of FIGS. 3 and 4, the crystal blades 732 form coupling antennas for coupling the incident radiation with the interface phonon polaritons supported at the interfaces of the crystal blades with the surrounding dielectric medium. The thickness e of the membrane corresponds to the width L of the walls 330 and the spacing E between the slits 733 corresponds to the height H of the walls 330.

The optimization of the structure is done in the same manner as described previously. Notably, in the case of a layout of a plurality of optical blades, they can be chosen to be of the same shape (for example square or rectangular) and the same sizes or on the contrary it is possible to vary the shapes and/or the sizes to widen the frequency band of use of the modulator. At the same time the blades can be laid out along a principal direction as shown in FIG. 7B or on the contrary, the blades can be laid out in two perpendicular directions so as to render the component insensitive to polarization.

A modulator such as described in FIGS. 7A and 7B is for example fabricated according to the following fabrication steps. On a substrate 710 (for example GaAs), a stop layer (for example $Al_{80}Ga_{20}As$) is deposited, for example by epitaxy, followed by a new layer of GaAs. Patterns are defined in the upper layer of GaAs using classic techniques of lithography and etching, patterns emerging at the stop layer. The substrate is then chemically etched down to the stop layer. The latter is then removed selectively and only the patterns etched previously remain in the form of a structured membrane.

As in the example in FIG. 3, the membrane thus formed can be illuminated by a control light source (not shown in FIG. 7A). The membrane can function in reflection or in transmission. In the latter case, a higher transmission will correspond to a better coupling intensity while a lower transmission will correspond to a poorer coupling intensity. Illumination of both sides of the membrane can also be envisaged to improve the efficiency of the modulation.

Figure 8:
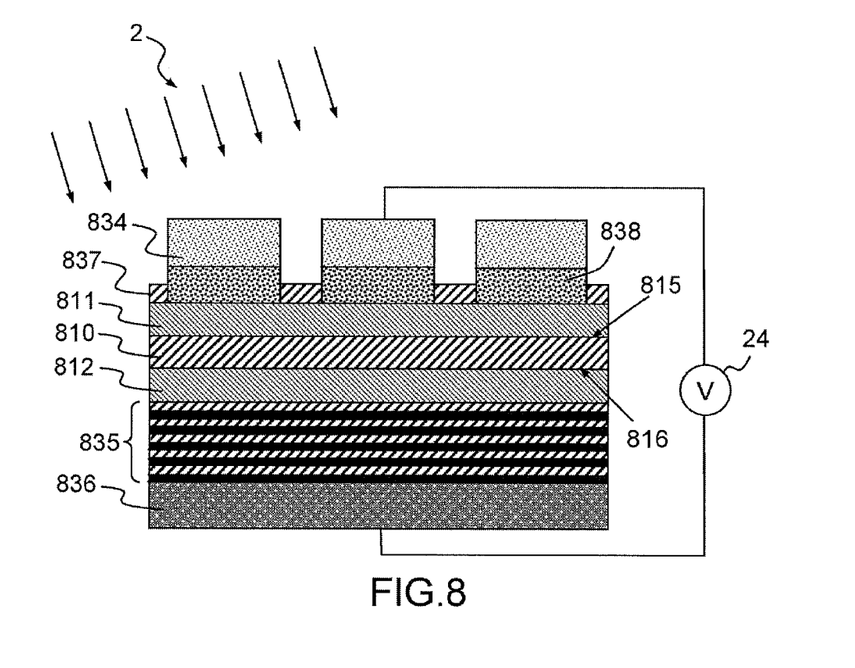
FIG. 8 shows a diagram of a terahertz modulator according to a second embodiment of the invention.
Figure 9:
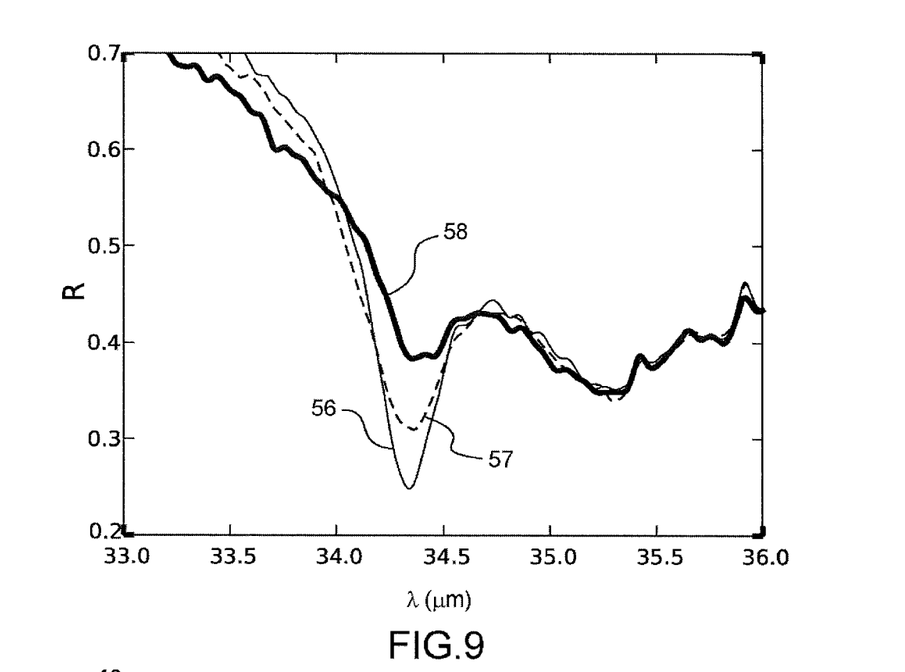
FIG. 9 shows curves of spectral reflectivity of the modulator according to the second embodiment of the invention for three distinct values of control of the modulator
Figure 10:
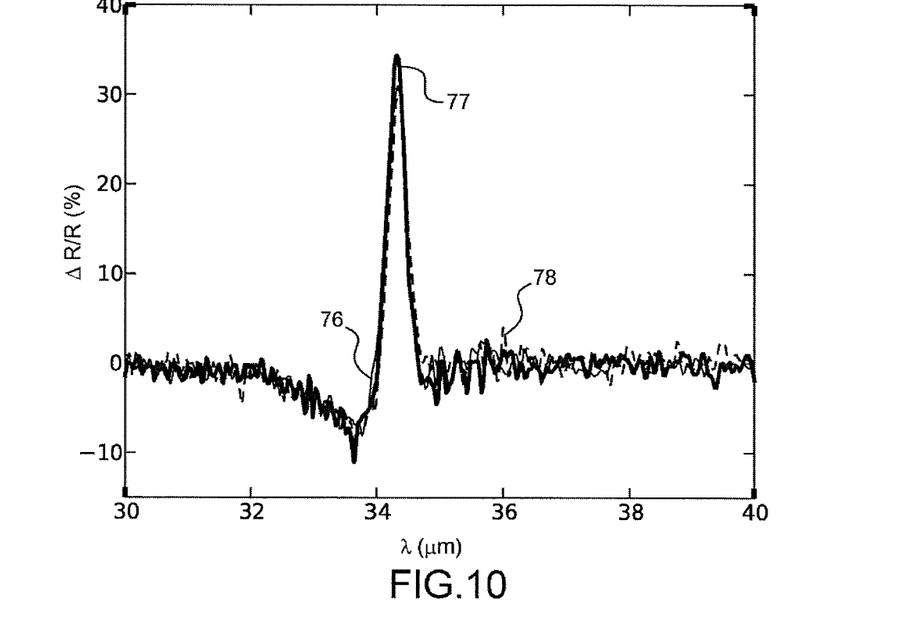
FIG. 10 shows the differential of the spectral reflectivity for a plurality of distinct angles of incidence of the terahertz radiation for the modulator according to the second embodiment of the invention.

An example of fabrication of a THz modulator according to the second embodiment (electrical means of control) is then described using FIGS. 8 to 10.

In this embodiment, the polar crystal 10 forms a thin layer in a successive stack of thin layers of semi-conductor materials, the means of control being formed by electrical means of control 24 and the coupling means being formed by a group of optical antennas 834 associated with a mirror 836 so as to form an optical cavity inside which the stack of thin layers of a semi-conductor material is arranged. Advantageously, a spacer 835 makes it possible to adjust the width of the cavity.

More precisely, the stack of thin layers successively comprises a first barrier layer 811, the thin polar crystal layer 810 and a second barrier layer 812. The barrier layers 811 and 812 each present an interface 815, 816 with the polar crystal layer 810 and are formed from dielectric semi-conductor materials with a high energy gap with respect to the polar crystal 810 such that the stack of the first barrier layer 811, of the thin polar crystal layer 810 and of the second barrier layer 812 form a quantum well the properties of which are used for the electrical control of the modulator, as will be explained in the following. The wide gap materials forming the layers 811 and 812 are chosen depending upon the polar crystal 810 used. For example, the polar crystal 810 can be formed from GaAs and the barrier layers 811 and 812 can be formed for example from an AlGaAs alloy with 33% aluminum $Al_{33}Ga_{67}As$).

The thicknesses of the layers 810, 811 and 812 are dictated by the electronic design of the structure. In particular, the thickness of the layer 810 is chosen so that the energy of transition between the energy levels of the quantum well formed by the layers 811-810-812 are close to the energy of the interface mode supported by the polar crystal 810. For example, for a quantum well in GaAs and barriers in $Al_{33}Ga_{67}As$, the desired energy is 36 meV, which gives a thickness of GaAs of 21 to 22 nm.

The population of the quantum well is assured by addition of carriers. This addition can be performed in various ways, known from the physics of field effect transistors (HEMT). For example, in the structure in FIG. 8, a doping plane (density $8 \times 10^{12}$ cm$^2$) is added into the barrier layer 811. Alternatively, the well can be directly doped or a volume doping of the barrier layer can be performed.

Other variants of the geometry of the wells can also be envisaged. For example according to a variant, a system formed from a plurality of quantum wells could be used.

The coupling means are formed in this example, by a group of optical antennas 834, advantageously metallic, associated with a mirror 836 so as to form an optical cavity. The thickness of the cavity, that can be adjusted by a spacer 835, and the sizing of the optical antennas 834, are determined so as to excite an interface phonon polariton mode at the interfaces 815 and 816 between the polar crystal 810 and the barrier layers 811 and 812. By adjusting the size of the spacer 835, the optical cavity makes it possible to concentrate the electromagnetic field in the quantum well. The mirror 836 is for example a substrate of doped GaAs, the doping allowing the GaAs to be rendered reflecting for the wavelengths considered, or of metal for example of gold. The formation of this cavity can allow the intensity of the field in the cavity to be enhanced by a factor of 5.

In addition, the applicant has shown that it is possible to benefit from the fact that the dielectric function of the polar crystal 10 is close to zero at the wavelength of the interface mode related to the quantum well. This allows the field to be very confined in the polar crystal. For example in the case of a quantum well in GaAs and barriers in $Al_{33}Ga_{67}As$, the enhancement factor for the field intensity is 140.

The fabricated structure thus benefits from two effects (cavity and dielectric function close to 0) to ultimately give an enhancement factor for the intensity of the field of about 700 while confining the electromagnetic field in the quantum well.

Advantageously, a protection layer 837, for example in GaAs, is deposited on the barrier layer 811 to prevent the oxidation of this layer. The coupling antennas 834 can be laid out in the form of a uni-dimensional group of metallic optical antennas. Alternatively, a group presenting a two dimensional pattern can be laid out to allow the structure to be insensitive to the polarization of the incident THz radiation. For example the optical coupling antennas 834 are formed from gold (Au). Advantageously, an attaching layer 838 is interposed between the upper layer of the stack and the group of optical antennas 834 to favor the adherence of the optical antennas to the modulator. For example, the attaching layer 838 can be formed from titanium (Ti). The spacer can be fabricated by epitaxy onto the doped GaAs substrate. The spacer 835 can be formed for example from an AlGaAs alloy with 50% aluminum Advantageously, the spacer 835 can be formed from alternating thin layers (a super-grating) of GaAs and AlAs. Advantageously, the whole stack can be formed by epitaxy. In the case of a reported technology, this layer can also be fabricated by another material (for example $Si_3N_4$, $SiO_2$).

A modulator according to the second embodiment such as described in FIG. 8 is fabricated for example according to the following fabrication steps. The layers 835, 812, 810, 811 and 837 are deposited by epitaxy on a substrate of doped GaAs 836. UV lithography is then performed in a photo-sensitive resin to define the geometry of the optical antennas. The layer 837 is chemically etched and the layers composing the optical antennas (attaching layer 838 and metallic layer 834) are deposited by evaporation.

The electrical means of control 24 can consist of a voltage source connected to the optical antenna grating 834 (electrically connected to each other) and to the mirror 836. The electrical means of control 24 allow the electron density in the quantum well to be controlled. The application of a negative voltage has the effect of raising the conduction band with respect to the Fermi level of the quantum well, leading to a sharp drop in the density of carriers. The inverse effect is obtained by applying a positive voltage. The conduction band is lowered, and this brings the bottom of the quantum well close to the Fermi level, and therefore increases the density of carriers in the well. The electrical control, by changing the electron density, will change the dielectric function of the well which will then no longer be as close to zero at the wavelength of the interface mode. Due to this, the excitation of the mode will be less effective. The applicant has shown that the modification of the coupling can be due to the electron plasma and/or to inter-sub-band transitions in the well.

FIG. 9 shows measurements of spectral reflectivity performed by the applicant on an exemplary THz modulator fabricated according to the second embodiment of the invention and such as described in FIG. 8. The measurements were performed with a Fourier Transform spectrometer. More precisely, the modulator, the reflectivity of which is shown in FIG. 9, comprises a mirror layer 836 of doped GaAs with $N_e=1.5 \cdot 10^{18}$ cm$^{-3}$, a spacer 835 formed by alternating single layers of GaAs and of AlAs with a total thickness of 700 nm, a 100 nm thick barrier layer 812 of $Al_{33}Ga_{67}As$, a 22 nm thick polar crystal (GaAs) layer 810, a 90 nm thick barrier layer 811 of $Al_{33}Ga_{67}As$, a 10 nm protection layer of GaAs, a 20 nm thick attaching layer 837 of Ti and a uni-dimensional grating of optical coupling antennas 834 of gold (Au) formed from fingers of height 200 nm, a filling factor of 0.65 and a 4 µm period. FIG. 9 comprises a first curve 57 that shows the spectral reflectivity of the modulator in a situation where the electrical means of control 24 are not activated, a second curve 56 that shows the spectral reflectivity of the modulator in a situation where the electrical means of control 24 are activated with a voltage of −0.3 V and a third curve 58 that shows the spectral reflectivity of the modulator in a situation where the electrical means of control 24 are activated with a voltage of 0.3 V. FIG. 9 reveals a trough in reflectivity which characterizes an absorption of the incident radiation for a narrow coupling frequency band lying in the Reststrahlen band of the polar crystal. The absorption is localized in the quantum well and as explained previously, the applicant has highlighted, plurality factors to explain this absorption. In particular, the dielectric function of the quantum well is close to zero at the resonance. In the quantum well, a two-dimensional gas of electrons has discrete energy levels in the direction perpendicular to the stack. Optically active inter-sub-band transitions can modify the coupling of the incident radiation with the interface phonon polariton mode by modifying the dielectric function. The contribution of these inter-sub-band transitions to the dielectric function is proportional to the population of electrons in the quantum well. By applying a negative voltage on the optical coupling antennas 834, it is possible to empty the quantum well of the electrons thereof and to inhibit inter-sub-band transitions. This allows the amplitude of an incident terahertz radiation with a frequency lying in the coupling band, to be modulated in reflection by modulating the voltage applied to the electrical means of control 24.

Generally, the properties of the quantum wells can be modified by adjusting the band diagram associated with the structure. The band calculations can be performed using freeware numerical codes, for example "1DPoisson" of G Snider. In particular, the energy of the inter-sub-band transitions can change as a function of the applied voltage, which will also have the effect of modifying the dielectric function to a greater or lesser extent. This effect, known as the Stark effect, has been observed by Harwitt et Harris, Applied Physics Letters, 50, 685 (1987). In the embodiment presented in FIG. 8, giving the results shown in FIG. 9, the energy of the inter-sub-band transitions is constant depending upon the applied voltage, the Stark effect being too weak to be observed. A variant can present a pronounced Stark effect. An additional layer can be added to the structure in FIG. 8, either between the well 810 and the barrier 811 (or 812), to obtain a pronounced Stark effect. This layer can be for example of AlGaAs with a lower concentration of aluminum than that of the barrier (<33%).

Generally, there is coupling between the plasma electrons and the polar optical phonons, which can change the frequency at which the dielectric function of the polar crystal is close to zero, and the frequency of the interface phonon polariton mode. Thus, the applicant has shown that the dielectric function of the quantum well can also be changed solely by the presence of electrons, without having recourse to inter-sub-band transitions.

FIG. 10 shows a graph which illustrates the relative variation of the spectral reflectivity of the modulator sample according to the second embodiment of the invention described previously, for plurality angles of incidence. FIG. 10 comprises a first curve 76 that shows the relative variation of the spectral reflectivity of the sample for an angle of incidence of the incident radiation of 15°, a second curve 77 that shows the relative variation of the spectral reflectivity of the sample for an angle of incidence of the incident radiation of 30° and a third curve 78 that shows the relative variation of the spectral reflectivity of the sample for an angle of incidence of the incident radiation of 50°. The relative variation of the reflectivity is defined here by:

$$\frac{\Delta R}{R} = \frac{R_+ - R_-}{R_-} \quad (3)$$

where $R_-$ is the reflectivity of the modulator 1 when the well is depleted and $R_+$ is the reflectivity of the modulator 1 when the carriers are present. $R_-$ is taken for a voltage of −0.3V. FIG. 10 demonstrates a large angular acceptance that agrees with theoretical calculations for the existence of coupling between the propagating field and the interface phonon polariton mode.

Notably, the modulator such as described in the present application can be applied to a data transmission system comprising a THz emission source, the modulator such as described for example according to the first or the second embodiment and a THz radiation detector, the modulator being controlled as a function of a signal containing said data.

While being described through a certain number of detailed examples of embodiments, the terahertz modulator according to the invention comprises different variants, modifications and improvements that will appear obvious to a person skilled in the art, it being understood that said different variants, modifications and improvements are within the scope of the invention, such as defined by the following claims.

The invention claimed is:

1. A terahertz modulator operable in a given frequency band of use comprising:
   a semi-conductor polar crystal having a Reststrahlen band, covering said frequency band of use and having at least one interface with a dielectric medium;
   coupling means allowing a resonant coupling of an interface phonon polariton (IPhP) supported by said interface and of an incident radiation of frequency in said frequency band of use; and
   means of control apt to modify the intensity of the resonant coupling between said interface phonon polariton and said incident radiation by modification of the dielectric function of the polar crystal in the Reststrahlen band of the polar crystal.

2. The modulator as claimed in claim 1, wherein said polar crystal has at least two interfaces with a dielectric medium, the distance between said interfaces being less than a few hundred nanometers to allow a coupling between interface phonon polaritons propagating along each of said interfaces.

3. The modulator as claimed in claim 2, wherein the distance between the two interfaces is less than a hundred nanometers.

4. The modulator as claimed in claim 1, in which the polar crystal is doped.

5. The modulator as claimed in claim 1, wherein the coupling means are integrally formed in the polar crystal.

6. The modulator as claimed in claim 5, wherein the polar crystal is structured to form one or a plurality of crystal blades each forming an optical antenna intended for coupling with the incident radiation, large faces of each of said blades forming two interfaces with a dielectric medium.

7. The modulator as claimed in claim 6, wherein the polar crystal is structured to form a group of plurality blades, laid out along a principal direction.

8. The modulator as claimed in claim 6, wherein the polar crystal is structured to form a group of plurality blades, laid out along two substantially perpendicular directions.

9. The modulator as claimed in claim 6, wherein the polar crystal is structured to form a group of plurality blades, each blade being identical.

10. The modulator as claimed in claim 6, wherein the polar crystal is structured to form a group of plurality blades and at least a part of the blades have a different shape from that of the others, allowing the frequency band of use of the modulator to be widened.

11. The modulator as claimed in claim 6, wherein the said blade(s) are laid out perpendicular to a substrate, said substrate being laid out in a plane perpendicular to the incident plane of the incident radiation.

12. The modulator as claimed in claim 6, wherein the said blade(s) are laid out in a plane and form a suspended membrane, the plane of the membrane being laid out in a plane perpendicular to the incident plane of the incident radiation.

13. The modulator as claimed in claim 5, wherein the means of control comprise a light source intended to illuminate said interface and with a given wavelength such that the energy of the photons produced by said light source is greater than the energy gap of said polar crystal.

14. The modulator as claimed in claim 1, wherein the polar crystal forms at least one thin layer surrounded by at least one first and one second barrier layers of semi-conductor dielectric material with a high energy gap so as to form with the polar crystal layer, at least one or a plurality of quantum wells.

15. The modulator as claimed in claim 14, wherein the coupling means comprise a group of nanoantennas and a mirror to form an optical resonance cavity inside of which said quantum well(s) are located.

16. The modulator as claimed in claim 15, wherein the coupling means in addition comprise a spacer to adapt the width of said optical resonance cavity.

17. The modulator as claimed in claim 14, wherein, wherein the means of control are electrical means of control for controlling the electron density in the quantum well(s).

18. A method of modulating an incident radiation of terahertz frequency in a given frequency band of use, the method comprising the steps of:

resonant coupling of the incident terahertz frequency radiation and of an interface phonon polariton at an interface of a semiconductor polar crystal having a Reststrahlen band, covering said frequency of use, and of a dielectric medium; and variation of the intensity of the resonant coupling by variation of the dielectric function of the polar crystal in the Reststrahlen band of the polar crystal.

19. The method of modulation as claimed in claim 18, wherein the variation of the dielectric function of the polar crystal is obtained by illuminating the polar crystal with a light source of a given wavelength such that the energy of the photons produced by said light source is greater than the energy gap of said polar crystal, the polar crystal being structured to form at least one antenna allowing coupling with the incident radiation.

20. The method of modulation as claimed in claim 18, wherein the polar crystal forms at least a thin layer between at least a first and a second barrier layer of semi-conductor dielectric material with a high energy gap so as to form one or a plurality of quantum wells, and the variation of the dielectric function of the polar crystal is obtained by applying a voltage to the polar crystal to control the electron density in the quantum well(s).

* * * * *